United States Patent [19]

Onoda et al.

[11] Patent Number: 5,126,687
[45] Date of Patent: Jun. 30, 1992

[54] AMPLIFIER SYSTEM FOR AUTOMATICALLY MINIMIZING DISTORTION

[75] Inventors: Masahiro Onoda, Sagamihara; Yoshifumi Toda, Tokyo, both of Japan

[73] Assignee: Fujitsu Limited, Kawasaki, Japan

[21] Appl. No.: 708,382

[22] Filed: May 31, 1991

[30] Foreign Application Priority Data

Jun. 7, 1990 [JP] Japan .................................. 2-149062

[51] Int. Cl.⁵ ............................................ H03F 1/32
[52] U.S. Cl. .................................. 330/149; 330/136
[58] Field of Search ................ 328/151; 330/107, 129, 330/136, 149, 151, 279

[56] References Cited

U.S. PATENT DOCUMENTS 3,900,823  8/1975  Sokal et al. ........................ 330/149
4,879,519 11/1989  Myer ................................... 330/149

*Primary Examiner*—Steven Mottola
*Attorney, Agent, or Firm*—Staas & Halsey

[57] ABSTRACT

An amplifier system includes a power amplifier which generates undesired distortion in its main output signal, and a distortion detecting circuit for detecting distortion spectrums included in the main output signal so as to output a distortion level indicating signal by attaining a difference of a main input signal having no distortion and a monitor signal representing the main output signal while the main input signal and the monitor signal are kept in phase and equal in level. The amplifier system also includes compensation circuit, provided at the input of the amplifier, for adding a compensation signal, to the main input signal which is to be equivalent generated equivalently to the distortion in the main output signal. The amplifier system further includes and a control circuit for precisely adjusting phase and level of the compensation signal so as to keep the distortion level indicating signals minimum. Phase/level adjustment in the distortion detecting circuit by minimizing the signal component remaining in the difference signal allows for better detection of the distortion component. Thus, less expensive filters can by employed in the distortion detecting circuit. The above-described automatic distortion compensation may be disabled when the main input signal is lower than a threshold level, where the automatic compensation operation becomes unnecessary and unstable.

15 Claims, 8 Drawing Sheets

AMPLIFIER SYSTEM FOR AUTOMATICALLY MINIMIZING DISTORTION

BACKGROUND OF THE INVENTION

1. Field of the Invention

The present invention relates to an automatic distortion-compensating amplifier system.

2. Description of the Related Art

FIG. 1 shows a typical prior art circuit configuration for automatically compensating a distortion generated in a main output signal So which is output from a power amplifier. In a distortion compensation circuit 2 a main input signal Si input thereto is added with a compensation signal which is generated in compensation signal generator 2-1. The compensation signal is generated equivalent in level but opposite in phase to the distortion component generated in power amplifier 1, that is, so as to cancel the distortion in advance. A monitor signal Sm picked up from main output signal So via a directional coupler 7 and a divider 9 is detected by a distortion detecting circuit 30 so as to output via filters a lower- and higher-band distortion level indicating signals $V_L$ and $V_H$. Phase and amplitude of the compensation signals is controlled in the distortion compensation circuit by control signals output from a control circuit 40 so as to keep levels of the lower- and higher-band distortion level indicating signals, $V_L$ and $V_H$, minimum. A division of the main input signal Si divided by directional coupler 6 and another monitor signal Sm divided by divider 9 are input to an AGC (automatic gain control) circuit 5 which controls the gain of power amplifier 1 to be constant.

FIG. 2 shows a circuit configuration of prior art distortion detecting circuit 30. Monitor signal Sm from divider 9 is input via a fixed attenuator 351 to a bandpass filter 352 which allows signal band as well as distortion component spectrums existing on both higher- and lower-outsides of the signal band, to pass therethrough, so as to reject unnecessary noise spectrums. An output signal from bandpass filter 352 is input to a mixer 353, where the input signal is converted to an IF (internal frequency) signal by being mixed with a local frequency signal from a local oscillator 354. IF signal output from mixer 353 is input to a band-elimination filter 356, where only the signal band is rejected, but both the higher-band and lower-band distortion spectrums near to the signal band are allowed to pass therethrough. Signal output from band-elimination filter 356 is equally divided by a divider 357, output signals of which are input to a lower-band distortion detecting circuit 358 as well as to a higher-band signal detecting circuit 359. Lower-band distortion detecting circuit 358 includes a bandpass filter 361 for allowing the lower-band spectrum of the distortion to pass; an amplifier 362 for amplifying the output of bandpass filter 361; a detector 363 for detecting mean amplitude of the amplified distortion component; and an amplifier 364 for amplifying the detected signal, where the output of amplifier 364 is a lower-band distortion level indicating signal $V_L$. In a similar way, higher-band distortion detecting circuit 359 includes a bandpass filter 365 for allowing the higher-band spectrum of the distortion to pass; an amplifier 366 for amplifying the output of bandpass filter 365; a detector 367 for detecting mean amplitude of the amplified distortion component; and an amplifier 368 for amplifying the detected signal, where the output of amplifier 368 is a higher-band distortion level indicating signal $V_H$. The outputs, $V_L$ and $V_H$, from distortion detecting circuit 30 are input to control circuit 40, which controls phase and level of the distortion compensation signal in distortion compensating circuit 2 so that the levels of thus detected distortion components, $V_L$ and $V_H$, become minimum.

Problems in the above described prior art configuration include the following. The distortion spectrums generated in the output signal appear generally in the immediate vicinity of the signal band, due to the narrow frequency spacing of the multi-channel signals. Therefore, band-elimination filter 356 for rejecting the signal band is required to have a sharp cut-off characteristic, and therefore is expensive. Band-elimination filters having less sharp cut-off characteristics can not adequately suppress the signal band. The remaining signal component prevents an accurate detection of the distortion component, accordingly, prevents distortion compensation circuit 2 from sufficiently accurately compensating the distortion.

Moreover, when the main input signal is small, such as when the number of the multi-channel carriers is small, the detection of distortion becomes difficult, resulting in unnecessary optimizing operation of control circuit 40 to seek for the minimum distortion conditions.

SUMMARY OF THE INVENTION

It is a general object of the invention, therefore, to provide a power amplifier system which can automatically compensate the distortion, without requiring a sharp cut-off characteristic in a band-elimination filter.

It is another object of the invention to provide a power amplifier system which can automatically compensate the distortion, without requiring a sharp cut-off characteristic in a band-elimination filter, and which can prevent unnecessary optimizing operation causing less stable operation, even when the main input signal is small.

An amplifier system according to the present invention comprises: a power amplifier which is liable to generate a undesired distortion in its main output signal, and a distortion detecting circuit for detecting distortion spectrums included in the main output signal so as to output a distortion level indicating signal, by attaining a difference of a reference signal representing a main input signal having no distortion and a monitor signal representing the main output signal while the reference signal and the monitor signal are kept in phase as well as at substantially equal levels. The amplifier system also includes compensation circuit for adding a compensation signal, which is a purposely generated distortion signal in the compensation circuit equivalently to the distortion component generated in the power amplifier, to the main input signal; and a control circuit for precisely adjusting phase and level of the compensation signal so as to keep the distortion level indicating signals minimum. A signal output from the compensation circuit is input to the power amplifier.

The amplifier system according to the present invention may further include means for detecting the main input signal level so as to disable the above-described automatic distortion compensation when the main input signal level is below a predetermined low level where the automatic compensation operation becomes unnecessary and unstable.

The above-mentioned features and advantages of the present invention, together with other objects and advantages, which will become apparent, will be more fully described hereinafter, with reference being made to the accompanying drawings which form a part thereof, wherein like numerals refer to like parts throughout.

A BRIEF DESCRIPTION OF THE DRAWINGS

DESCRIPTION OF THE PREFERRED EMBODIMENTS

Figure 1:
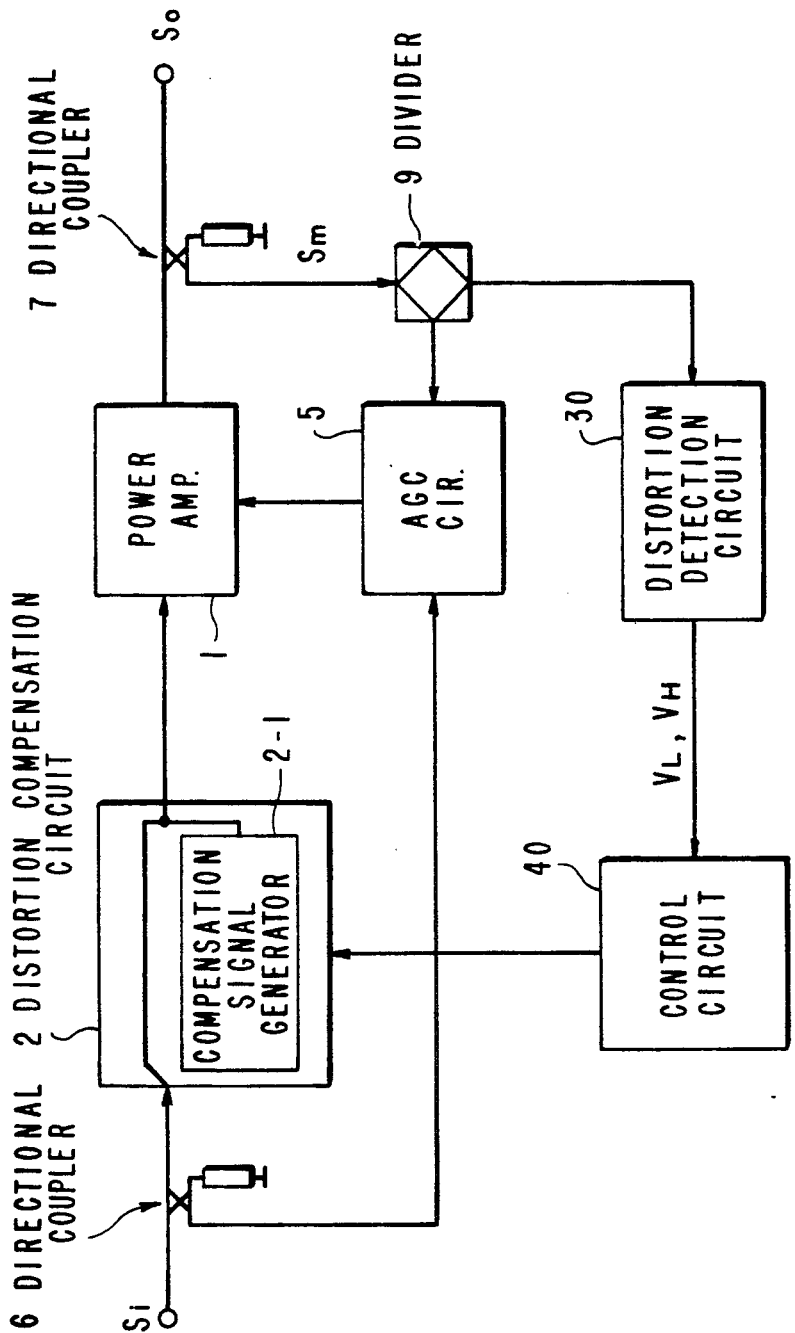
FIG. 1 is a circuit block diagram of a prior art power amplifier system having automatic distortion compensation.
Figure 2:
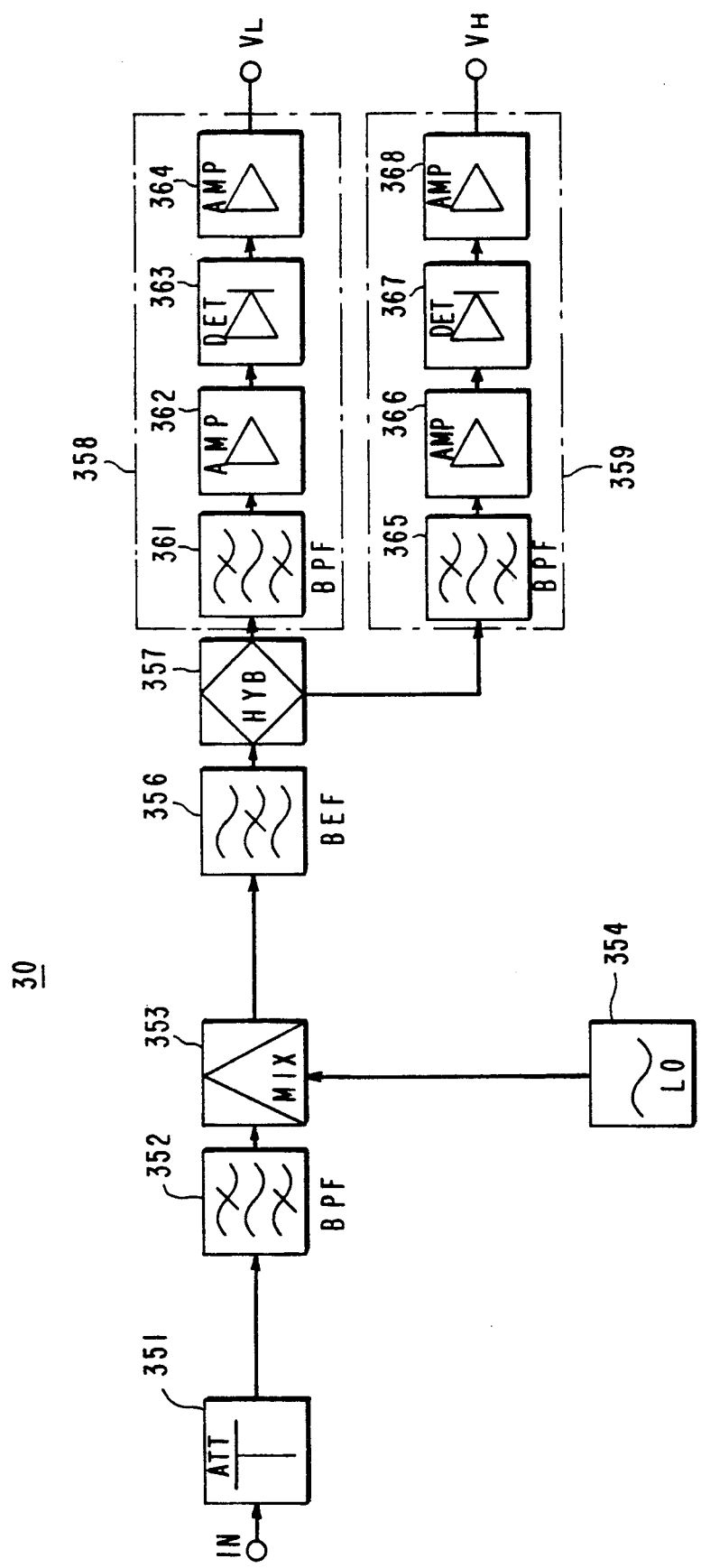
FIG. 2 is a circuit block diagram of a distortion detecting circuit employed in the FIG. 1 prior art system.

Referring to a preferred embodiment of the present invention schematically shown in FIG. 3, the present invention is hereinafter explained. A main input signal Si to be amplified is input via a distortion compensating circuit 2 to a power amplifier 1, which is liable to generate distortion in its output signal (referred to hereinafter as a main output signal) So, accordingly, now subject to the distortion compensation. Distortion compensating circuit 2, which is identical to compensation circuit 2 of the FIG. 1 prior art, includes a compensation signal generator 2-1 which generates a compensation signal which is substantially equal to the distortion component included in the main output signal So, and an adder circuit (not shown in FIG. 3) for adding the compensation signal to the main input signal Si to be input to power amplifier 1. Distortion detecting circuit 3, which is newly provided by the present invention, includes a subtraction circuit 206 for reducing a reference signal IN1 divided from the main input signal Si via directional coupler 6, a divider 8 and divider 10, from a monitor signal IN2 representing the main output signal So including the distortion divided from the main output signal So via a directional coupler 7 and a divider 9. This subtraction is carried out by summing the two signals IN1 and IN2 input to subtraction circuit 206, while being kept opposite in phase and equal in level with each other. These phase/level conditions are achieved in a phase/level adjusting circuit 203 by adjusting the phase and level of the input signals IN1 and IN2 which are supplied to subtraction circuit 206 based on control signals CONT 1 and CONT 2 output from a control circuit 4 so as to minimize a remaining-signal level indicating signal $V_F$ which is a detected output of signal component which is selectively output from subtraction circuit 206 by a signal component detection circuit 208 which is a bandpass filter in the preferred embodiment. Distortion components exist not only in the signal band but also in bands located adjacently outside the signal band. Therefore, the output signal of subtraction circuit 206 is also picked up by a distortion component detecting circuit 207 having bandpass filters 110 and 111 whose pass-bands are adjacent to the outside of the signal bands, so as to output lower- and higher-distortion level indicating signals $V_L$ and $V_H$. Control circuit outputs control signals CONT 3 and CONT 4 to adjust phase and level of the compensation signal to be added to the main input signal in distortion compensating circuit, so that the distortion level indicating signals $V_L$ and $V_H$ become minimum. An AGC (automatic gain control) circuit 5 receives, via divider 10, the reference signal divided from main input signal Si, and the monitor signal Sm via divider 9, divided from the main output signal So, so as to keep power amplifier 201 having a constant power gain.

Details of each block diagram shown in FIG. 3 embodiment are hereinafter described. FIG. 4 shows details of circuit configuration of distortion detecting circuit 3. A reference input signal IN1 divided by a first directional coupler 6 from the main input signal Si is input via a first divider 8, formed of a hybrid circuit, and a second divider 10, formed of a hybrid circuit, to distortion detecting circuit 3. In distortion detecting circuit 3, reference signal IN1 is input via an interface matching circuit, formed of a first fixed attenuator 301, and a first amplifier 302, a first variable attenuator 303 and a first variable phase-shifter 304, to a first adder 306, to which there is also input the monitor signal IN2 divided by a second directional coupler 7 from the main output signal So of power amplifier 1 via a third divider 9, formed of a hybrid circuit, and a second fixed attenuator 305. The two signals IN1 and IN2 input to adder 306 are controlled to be opposite with each other in phase and equal in level with each other by first variable phase-shifter 304 and first variable attenuator 303, controlled respectively by first control signal CONT 1 and second control signal CONT 2. The phase/level controls are described later in detail. In adder 306, the reference signal IN1 is subtracted from the monitor signal IN2, so that the difference, i.e. only the distortion component, is output therefrom. Therefore, adder 306 is referred to hereinafter as a subtraction circuit. Due to the subtraction operation, the signal band is attenuated by 30 to 50 db in the output of subtraction circuit 306; however, there still remains some signal component.

Output from subtraction circuit 306 is input, via a bandpass filter 307 having a bandwidth, for example 20 MHz, through which both the signal component, i.e. signal spectrum, remaining therein and distortion components, i.e. spectrums, existing in the higher- and lower- bands outside the signal band are allowed to pass but noise components are rejected, to a mixer 308 where the remaining signal and the distortion components are converted to an IF (internal frequency) of typically 70 MHz by a local frequency input from a local frequency oscillator 309. IF output from mixer 310 is divided in two by a fourth divider 308, formed of a hybrid circuit.

A first output from fourth divider 310 is input to a remaining signal component detecting circuit 315, where the input signal thereto is input, via a second bandpass filter 329 of typically 20 MHz bandwidth which passes only the signal spectrum, and an IF amplifier 330, to a detector 331 where mean value of the IF signal, i.e. remaining signal component level, is detected. Detected output from detector 331 is amplified by a low-frequency amplifier 332, so as to output the remaining signal-component level indicating signal $V_F$.

Remaining signal-component level indicating signal $V_F$ is processed by a control circuit 4 to output first control signal CONT 1 and a second control signal CONT 2 to adjust respectively first variable phase-shifter 304 and first variable attenuator 303, so that signal-component level indicating signal $V_F$ becomes minimum. Operation of control circuit 4 is described later in detail, referring to FIG. 7.

A second output from fourth divider 310 is input to a band-elimination filter 311 which attenuates the signal bands, of typically 20 MHz, by 20 to 40 db, but allows the distortion spectrums existing outside the signal bands to pass. Output from band-elimination filter 311 is input to a fifth divider 312, formed of a hybrid circuit, outputs from which are input respectively to a lower-band distortion component detecting circuit 313 and a higher-band distortion component detecting circuit 314. In lower-band distortion component detecting circuit 313, the input signal thereto is input, via a third band-pass filter 321 having a typically 8 MHz bandwidth to pass only the lower-band of the distortion components, and an IF amplifier 322, to a detector 323 where mean value of the lower-band distortion component is detected. Detected output from detector 323 is amplified by a second low-frequency amplifier 324, so as to output the lower-band distortion level indicating signal $V_L$. In higher-band distortion component detecting circuit 314, the input signal thereto is input, via a fourth bandpass filter 325 having a typically 8 MHz bandwidth to pass only the higher-band of the distortion components, and an IF amplifier 326, to a detector 327 where mean value of the higher-band distortion component is detected. Detected output from detector 327 is amplified by a third low-frequency amplifier 328, so as to output the higher-band distortion level indicating signal $V_H$. The higher- and lower-band distortion level indicating signals $V_L$ and $V_H$ are input to control circuit 4, which then outputs control signals CONT 3 and CONT 4 to distortion compensating circuit 2, so as to keep $V_L$ and $V_H$ minimum. Operation of control circuit 4 is described later in detail, referring to FIG. 8.

Figure 5:
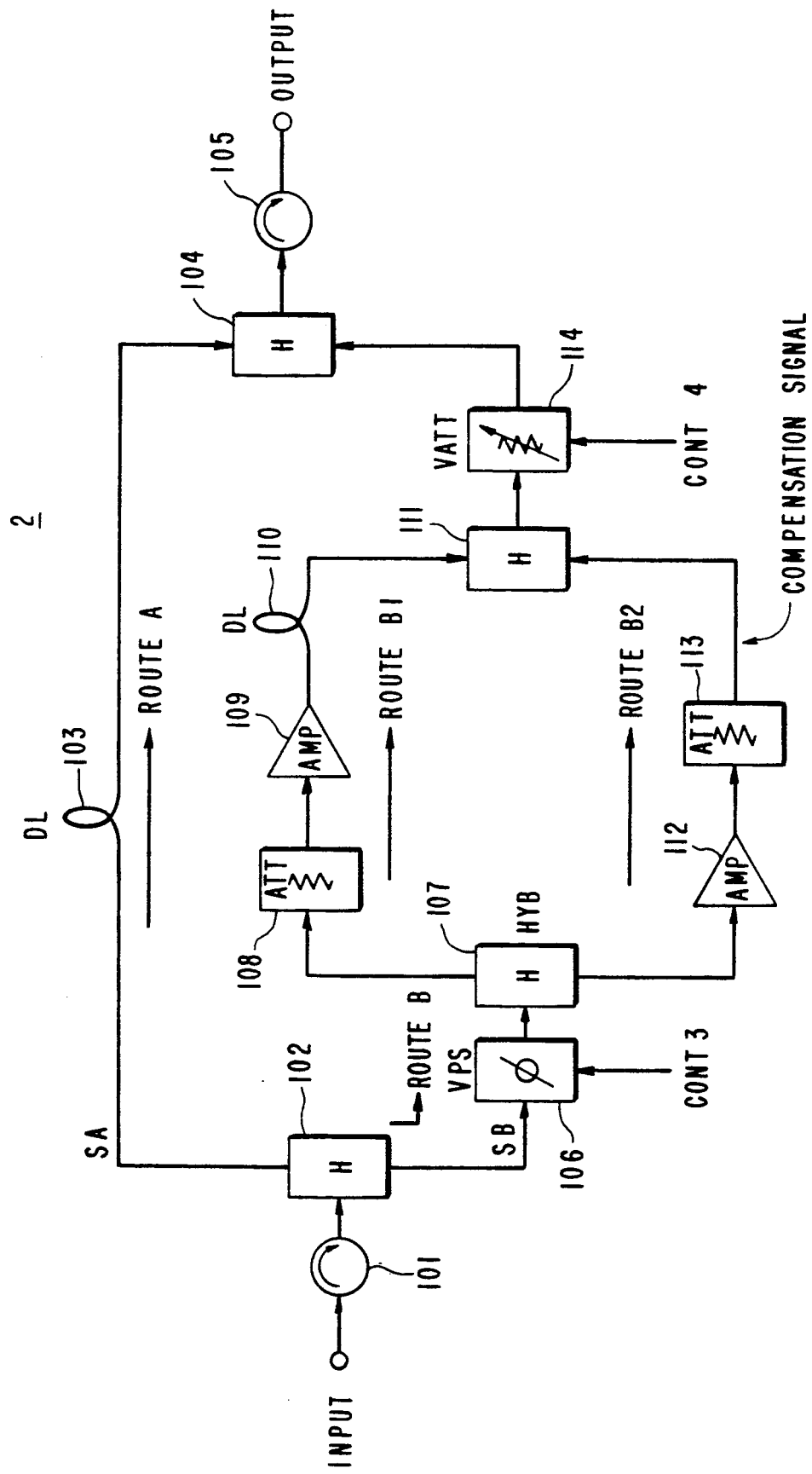
FIG. 5 is a circuit block diagram of a distortion compensating circuit.

FIG. 5 shows details of the circuit configuration of distortion compensating circuit 2. A main input signal Si is input via a circulator 101 to a sixth divider 102, formed of a hybrid circuit, where the input signal is divided into two signals, a first one $S_A$ propagating through a first route A and a second one $S_B$ propagating through a second route B.

In first route A, the input signal $S_A$ is delayed by a first delay line 103 for a predetermined delay time which is equivalent to, but shifted by 180 degrees, relative to the delay time of second route B, and is input to a second adder 104, formed of a hybrid circuit.

In second route B, the input signal $V_B$ thereto is delayed by a second variable phase shifter 106 whose delay time is controlled by third control signal CONT 3 from control circuit. The manner of the delay control is described later in detail. Output from second variable phase shifter 106 is input to a seventh divider 107, formed of a hybrid circuit, where the input signal is divided into two signals, a first one $S_{B1}$ propagating through a route B1 and a second one $S_{B2}$ propagating through a route B2.

In route B1, input signal $S_{B1}$ is attenuated by a third fixed attenuator 108, amplified by a second RF amplifier 109, delayed by a second delay line 110 and then input to a third adder 111 formed of a hybrid circuit.

In route B2, input signal $S_{B2}$ thereto is amplified by a third RF amplifier 112, attenuated by a fourth fixed attenuator 113, and then input to third adder 111. Third RF amplifier 112 outputs the same distortion component in its output signal as power amplifier 1. Attenuations by third and fourth fixed attenuators 108 and 113 are chosen large enough for second RF amplifier 109 to operate in its linear range so as to output very little distortion compared with third RF amplifier 112, and so that the two input signals to third adder 111 from two routes B1 and B2 are equal in level to each other. Delay time in second delay line 110 is chosen so that the two signals from the two routes B1 and B2 are added in an opposite phase with each other by third adder 111. Accordingly, third adder 111 outputs their difference, i.e. only the distortion components. Level of the distortion components output from third adder 111 is adjusted by a second variable attenuator 114, attenuation of which is controlled by fourth control signal CONT 4 from controller 204. Manner of the attenuation control is described later in detail. Output of second variable attenuator 114 is input to second adder 104, where, as described already, the signal from route B is added to the signal $S_A$ from route A oppositely in phase owing to first delay line 103, so as to cancel in advance the distortion which will be generated in power amplifier 1. Accordingly, the signal from route B2 is referred to hereinafter as a compensation signal.

Figure 3:
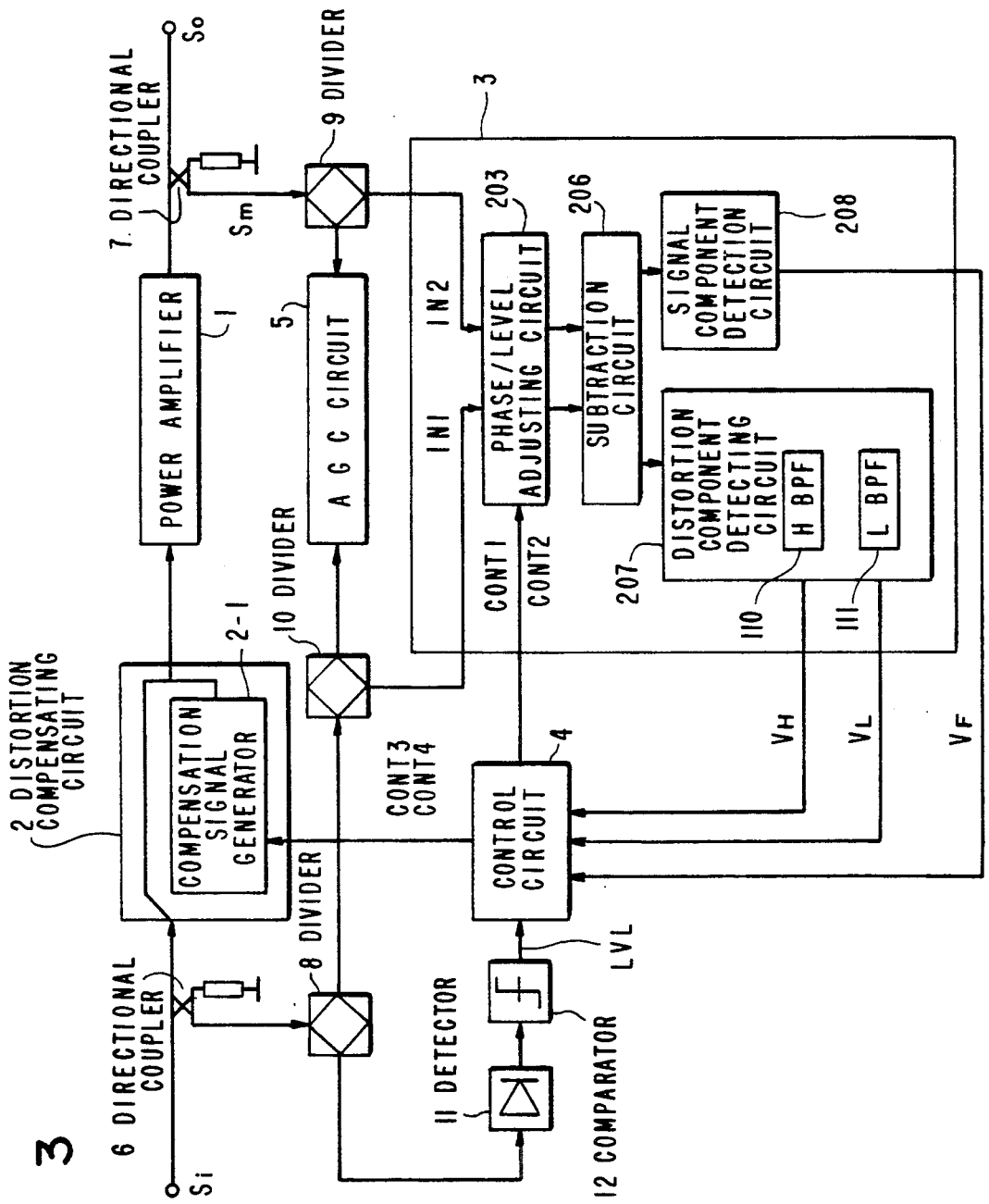
FIG. 3 is a circuit block diagram schematically showing a preferred embodiment of the amplifier system of the present invention.
Figure 4:
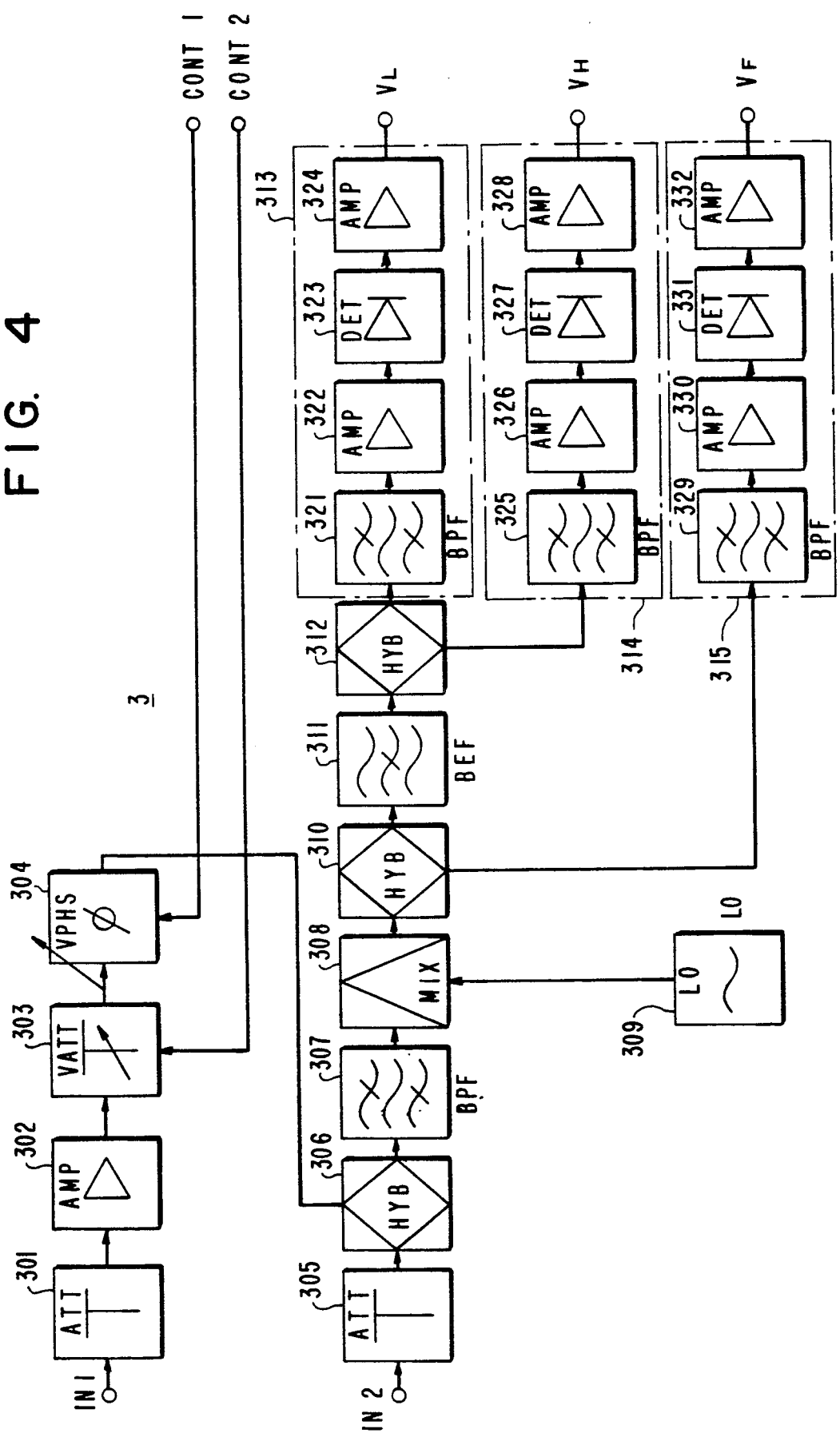
FIG. 4 is a circuit block diagram of a distortion detecting circuit of the embodiment of FIG. 3.

Main input signal Si is also divided by first divider 8 so as to be input to a fourth detector 11 shown in FIG. 3. The detected output level is compared by a comparator 12 with a predetermined low threshold level. The compared result, i.e. main input signal level indicator LVL, is then input to control circuit 4. Function of the main input signal level indicator LVL is described later in detail.

Figure 6:
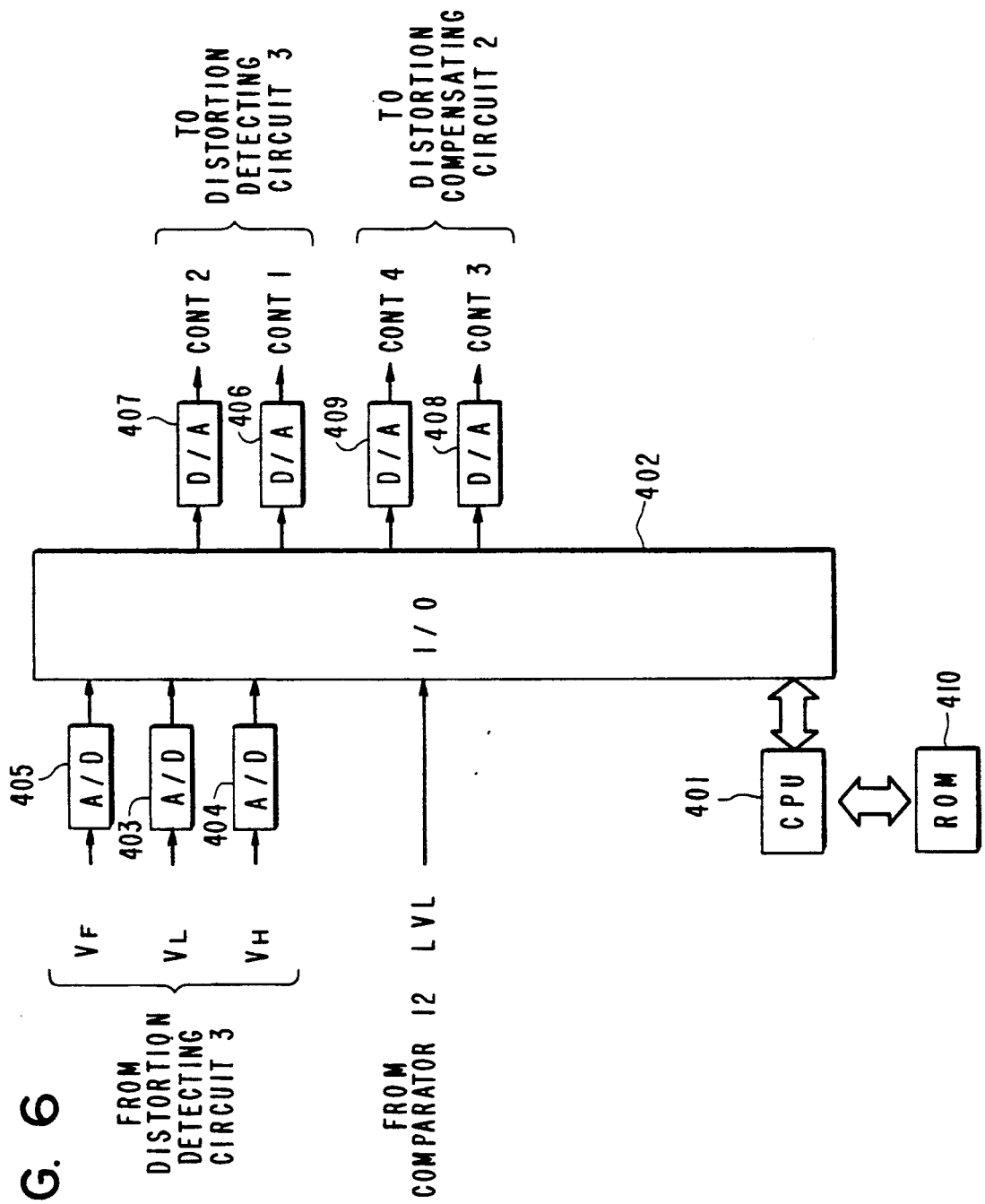
FIG. 6 is a circuit block diagram of a control circuit to control the FIG. 5 distortion compensating circuit.

FIG. 6 shows details of the circuit configuration of control circuit 4. CPU (central processing unit) 401 is provided to control the system operation. ROM (read only memory) 410 stores control programs, etc. for CPU 401. Remaining signal-component level indicating signal $V_F$, lower- and higher-bands distortion level indicating signals $V_L$ and $V_H$ are input from distortion detecting circuit 3, via A/D converters (analog-to-digital converters) 405, 403 and 404, respectively, and via an input/output interface 402, to CPU 401. Main input signal level indicator LVL is also input from comparator 12 via I/O interface 402 to CPU 401. Control signals CONT 1 to CONT 4 are output from CPU 401 via I/O interface 402 and D/A converters (digital-to-analog converters) 406 to 409, respectively.

Figure 7:
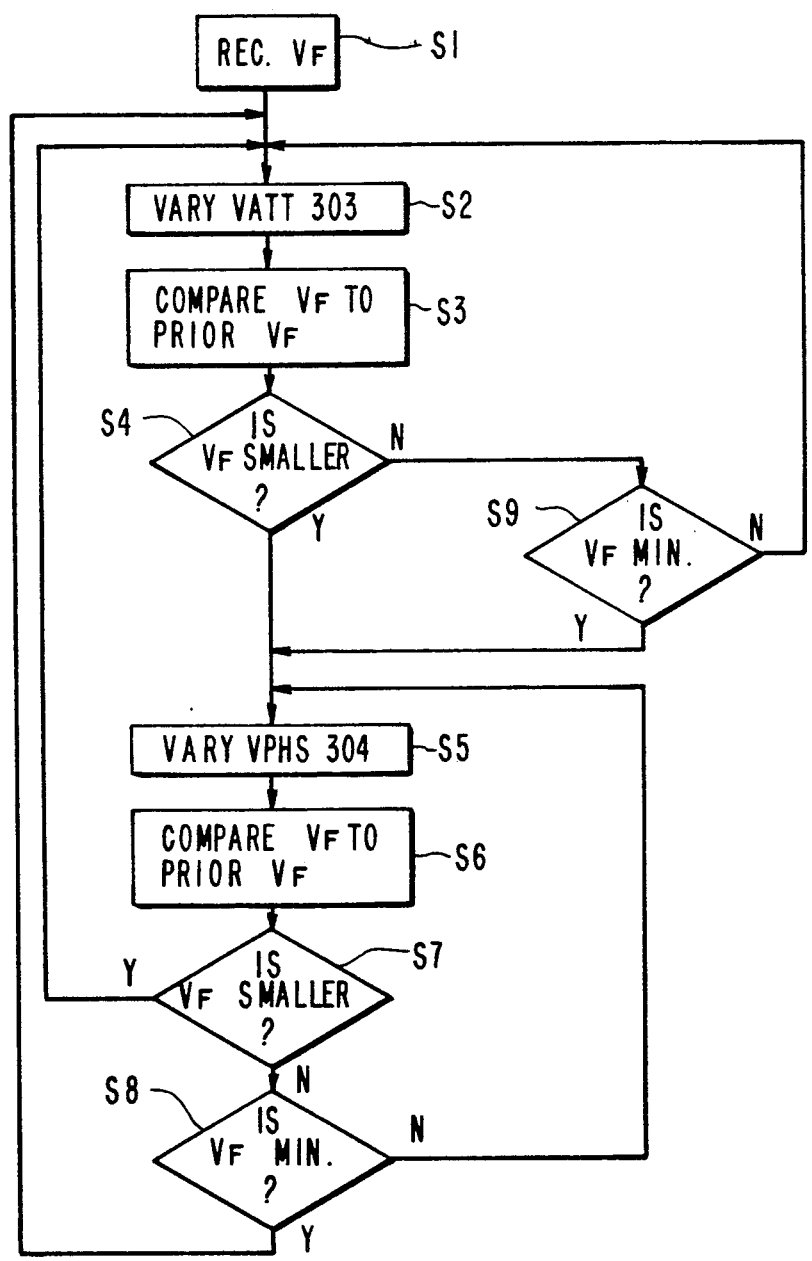
FIG. 7 is a flow chart of the procedure for controlling signal component minimum in the FIG. 4 distortion detecting circuit.

Control operations of CPU 401 are hereinafter described. FIG. 7 is a flow chart showing the operation of control circuit 4 to suppress remaining signal component in distortion detecting circuit 3. On receiving the remaining signal-component level indicating signal $V_F$ (step 1, referred to hereinafter simply as S1 in the figure), CPU 401 outputs control signal CONT 2 to vary the attenuation in variable attenuator 303 by a predetermined amount (step 2). Then, the value of $V_F$ is compared with a previous value of $V_F$ in step 3. It is then determined whether $V_F$ is lower (step 4) than the previous value of $V_F$ prior to varying the attenuation. If $V_F$ is lower, the phase delay is varied in phase-shifter 304 by a predetermined amount via control signal CONT 1 (step 5). Then $V_F$ is compared with that prior to varying the phase delay (step 6). If $V_F$ is lower (step 7), the above described steps are repeated (steps 2 to 7). In step 4, if $V_F$ is not lowered, it is determined whether the $V_F$ prior to varying the attenuation is minimum (step 9). If such $V_F$ is not minimum, the attenuation of variable attenuator 303 is again varied in the direction opposite to that of prior step 2 (steps 2 to 4 and 9). If $V_F$ is minimum, the phase delay in variable phase-shifter 304 is varied in. Similarly in step 7, if $V_F$ is not lower than the $V_F$ prior to varying the phase delay, it is determined whether $V_F$ is minimum (step 8). If $V_F$ is not minimum, the phase delay in phase-shifter 304 is again varied in the direction opposite to that of prior step (steps 5 to 8). If $V_F$ is minimum, the attenuation in variable attenuator 303 is again varied (step 2). By repeating the above steps, the signal component remaining in the output of second adder 306 reaches the minimum.

Figure 8:
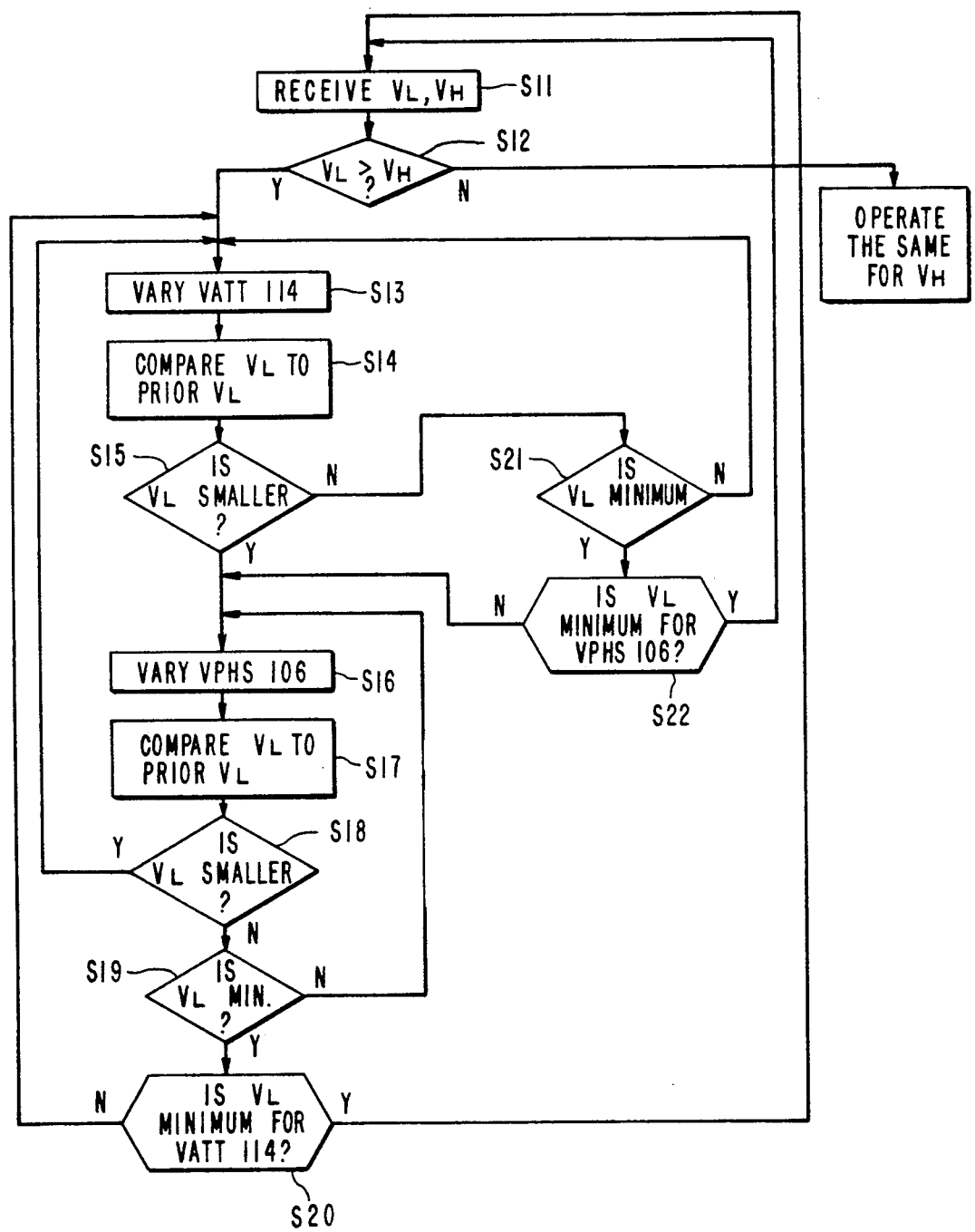
FIG. 8 is a flow chart of the procedure for controlling distortion components minimum in the FIG. 5 distortion compensating circuit.

FIG. 8 is a flow chart showing the operation of control circuit 4 to suppress distortion components in distortion compensating circuit 2. On receiving lower- and higher-bands distortion level indicating signals $V_L$ and $V_H$ from the distortion detecting circuit 3 (step 11), levels of $V_L$ and $V_H$ are compared with each other (step 12). If $V_L$ is larger than $V_H$, the attenuation of second variable attenuator 114 is varied by a predetermined amount by control signal CONT 4 (step 13). The level of the current $V_L$ is compared with that prior to varying the attenuation (step 14). If $V_L$ is lower (step 15), the phase delay is varied in phase-shifter 106 by a predetermined amount via control signal CONT 3 (step 16). The level of the current $V_L$ is then compared with that prior to varying the attenuation (step 17). If $V_L$ is lower, steps 13 and 18 are repeated. If $V_L$ is not lower in step 15, it is determined whether $V_L$ is minimum for variable attenuator 114 (step 21). If $V_L$ is not minimum, the attenuation of variable attenuator 114 is varied in the direction opposite to that of the prior step (steps 13 to 15). If $V_L$ is minimum, it is determined whether $V_L$ is minimum also for variable phase-shifter 106 (step 22). If $V_L$ is not minimum, the phase delay in variable phase-shifter 106 is varied in the direction opposite to that of the prior step (step 16). If $V_L$ is minimum, $V_L$ and $V_H$ are again received and compared in steps S11 and S12. If $V_H$ is larger than $V_L$ in the step 12 comparison, the same steps as the above steps 13 to 22, are repeated but employing $V_H$ in place of $V_L$. According to the above control steps, the optimum amount of the optimum phase of distortion component is added in advance to the input signal to power amplifier 1, so as to cancel the distortion which will be generated in power amplifier 1.

The FIG. 8 operation to reduce the distortion spectrum existing outside the signal band reduces also the distortion component existing in the signal band, therefore, as a result, contributes to more accurately detect the remaining signal component in the FIG. 7 operation to suppress the signal component. It can be similarly said that the FIG. 7 operation contributes to more accurately suppress the distortion in FIG. 8 operation. Therefore, concurrently carrying out of the two independent operations of FIG. 7 and FIG. 8 is effective to achieve the best distortion compensation.

When the main input signal Si becomes lower than a predetermined low threshold level such as the case where only ten channels (ten carriers) out of allocated 128 channels are on duty, where the distortion compensation is not required, accordingly, the unnecessarily seeking for the optimum attenuation and phase delay in distortion compensating circuit 2 should be avoided, main input signal level indicator LVL inform this fact to CPU 401 so that CPU 401 disables the above-described automatic distortion compensating operations. Then, the attenuation in variable attenuators 114 and 303 and phase delays in variable phase-shifters 106 and 304 are fixed at the amounts set just before disabling the automatic compensation. When the main input signal level becomes larger than the predetermined threshold value, control circuit 4 resumes the automatic distortion compensation operation.

In embodying the present invention, there can be various modifications. For example, though in the above preferred embodiment the processings for suppressing the distortion in the distortion compensating circuit 2 are carried out by the software in CPU 401, it is apparent that this function can be achieved with a hardware installed in distortion detecting circuit 3. For another example, in FIG. 4 the phase/level adjustment can be carried out for monitor signal IN2 instead of reference signal IN1. Also in FIG. 5 the phase/level adjustment can be carried out for signal Sa of route A instead of signal Sb from route B.

Though in the above preferred embodiment, the distortion components are detected individually from the lower- and higher-bands, and fed forward to the distortion compensating circuit 2, it is apparent that the distortion component can be detected for the sum of both the bands as a single distortion level indicating signal, which is processed by control circuit 4 in the similar way to that of the above-described preferred embodiment.

The procedures shown in FIGS. 7 and 8 for seeking for optimum conditions are referred to as examples only. It is apparent that many other procedures are possible to achieve the concept of the present invention.

In the present invention, as a result of the accurate suppression of the remaining signal component in distortion detecting circuit 3, the band-eliminating filter 311 is not required to have sharp cut-off characteristics of band-eliminating filter 356 employed in the prior art circuit, even when the spectrums of the distortion components are close to the signal sidebands. Accordingly, the band-eliminating filter 311 may be of a less expensive type relative to the prior art. Moreover, the band-elimination filter 311 can be deleted depending on the required specification.

The automatic distortion compensating system according to the present invention is effective particularly for a transmitter which amplifies multiple channel phase-modulated carriers, such as 128 channels for a mobile telephone base station, where the number of the channels in use is always changing, and the power amplifier is required to have a dynamic range linear enough to handle the peak envelope of the multiple channel signals so that cross-modulation between the channels must be strictly limited. When a currently available micro processor chip is employed for CPU 401, the optimizing operations shown in FIGS. 7 and 8 can be finished in 10 to 100 ms, which is short enough for the mobile telephone transmitter application.

The many features and advantages of the invention are apparent from the detailed specification and thus, it is intended by the appended claims to cover all such features and advantages of the methods which fall within the true spirit and scope of the invention. Further, since numerous modifications and changes will readily occur to those skilled in the art, it is not detailed to limit the invention and accordingly, all suitable modifications are equivalents may be resorted to, falling within the scope of the invention.

What I claim is:

1. An amplification system supplied with a main input signal, comprising:
   an amplifier for outputting a main output signal including a distortion;
   a distortion detecting circuit coupled to said amplifier, for generating a difference signal which is a difference of a monitor signal divided from said main output signal and a reference signal divided from the main input signal to be amplified by said amplification system, by adding said monitor signal and said reference signal which are kept equal in level and opposite in phase, said difference signal containing a distortion component corresponding to said distortion; and
   a compensation circuit coupled to said amplifier and said distortion detecting circuit, for adding a compensation signal which is substantially identical to said distortion component, to said main input signal, a level and a phase of said compensation signal being adjusted so as to keep said distortion component output from said distortion detecting circuit minimum, a signal output from said compensation circuit being input to said amplifier,
   whereby said distortion is canceled in advance by said compensation signal.

2. An amplification system as recited in claim 1, wherein said distortion detecting circuit includes:
   means for adjusting said phase and said level of at least one of said monitor signal and said reference signal to be added so as to minimize a signal component remaining in said difference signal.

3. An amplification system as recited in claim 2, wherein said distortion detecting circuit further includes:
   a subtracting circuit for outputting said difference signal;
   a first variable phase-shifter and a first variable attenuator coupled to said subtracting circuit, for adjusting at least one of said monitor signal and said reference signal to be input to said subtracting circuit;
   a first detection circuit coupled to said subtracting circuit, for outputting a first level-indicating signal representing a level of said remaining signal component, based on said difference signal;
   a second detection circuit coupled to said subtracting circuit, for outputting a second level-indicating signal representing a level of said distortion component, based on said difference signal; and
   control means coupled to said first variable phase-shifter and said first variable attenuator, for adjusting said first variable phase-shifter and said first variable attenuator so as to minimize said first level-indicating signal.

4. An amplification system as recited in claim 3, wherein said first detection circuit includes:
   a first filter for allowing a signal band covering said signal component to pass; and
   a first detector coupled to said first filter, for detecting a level of said signal component having passed through said first filter, so as to output said first level-indicating signal.

5. An amplification system as recited in claim 3, wherein said second detection circuit includes:
   a second filter for allowing lower band spectrums of said distortion component, located at a lower range of frequencies outside of said signal band, to pass;
   a second detector coupled to said second filter, for detecting a level of said lower band spectrums having passed through said second filter, so as to output said second level-indicating signal;
   a third filter for allowing higher band spectrums of said distortion component, located at a higher range of frequencies outside of said signal band, to pass; and
   a third detector coupled to said third filter, for detecting a level of said higher band spectrums having passed through said third filter, so as to output said third level-indicating signal.

6. An amplification system as recited in claim 1, wherein said compensation circuit includes:
   a compensation signal generating circuit for outputting said compensation signal; and
   a second variable phase-shifter and a second variable attenuator coupled to said compensation signal generating circuit, for adjusting at least one of a phase delay and an attenuation of said compensation signal to be added to said main input signal, said second variable phase-shifter and said second variable attenuator being controlled so as to minimize the distortion component in said difference signal.

7. An amplification system as recited in claim 5, further comprising:
   means for adjusting at least one of a phase delay and an attenuation of the compensation signal to be added to said main input signal so as to minimize both said second level-indicating signal and said third level-indicating signal.

8. An amplification system as recited in claim 2, wherein said means for adjusting includes a digital data processing unit for modifying the phase and the level of at least one of said monitor signal and said reference signal.

9. An amplification system as recited in claim 1, wherein said means for adjusting includes a digital data processing unit for modifying the phase and the level of said compensation signal.

10. An amplification system as recited in claim 9, wherein said means for adjusting of phase and level of said compensation is programmed so as to minimize a level of a higher one of said second level-indicating signal and said third level-indicating signal.

11. An amplification system as recited in claim 1, further comprising:
    an input level detecting circuit coupled to said compensation circuit, for determining whether a level of a main input signal to be amplified by said system is lower than a predetermined threshold level, said compensation circuit being disabled when said level is lower than said predetermined threshold level.

12. An amplification system as recited in claim 6, further comprising:
    means for adjusting said second variable phase-shifter and said second variable attenuator so as to minimize both said second level-indicating signal and said third level-indicating signal.

13. An amplification system as recited in claim 6, wherein said means for adjusting includes a digital data processing unit for modifying the phase and the level of said compensation signal.

14. An apparatus supplied with an input signal, for reducing distortion in an output signal of an amplifier system, comprising:

means for adjusting a phase of a first monitor signal responsive to one of the output signal and an input signal to the amplifier system, based on a first control signal;

means for adjusting a level of the first monitor signal based on a second control signal;

means for subtracting the first monitor signal from a second monitor signal responsive to the other of the output signal and the input signal, to generate a difference signal;

means for minimizing a level of a signal component included in the difference signal by generating and adjusting at least one of the first control signal and the second control signal; and means for minimizing at least one of a higher band distortion level and a lower band distortion level included within the difference signal and being above and below, respectively, a frequency range of the signal component, by generating a compensation signal and by adjusting at least one of a phase and a level of the compensating signal which is added to the input signal to reduce distortion in the output signal.

15. A method for reducing distortion in an output signal of an amplifier system, comprising the steps of:

a) adjusting a phase of a first monitor signal responsive to one of the output signal and an input signal to the amplifier system, based on a first control signal;

b) adjusting a level of the first monitor signal based on a second control signal;

c) subtracting the first monitor signal from a second monitor signal responsive to the other of the output signal and the input signal, to generate a difference signal;

d) minimizing a level of a signal component included in the difference signal by generating and adjusting at least one of the first control signal and the second control signal; and e) minimizing at least one of a higher band distortion level and a lower band distortion level included within the difference signal and being above and below, respectively, a frequency range of the signal component, by generating a compensation signal and by adjusting at least one of a phase and a level of the compensating signal which is added to the input signal to reduce distortion in the output signal.

* * * * *